(12) United States Patent
Chen et al.

(10) Patent No.: US 7,564,709 B2
(45) Date of Patent: Jul. 21, 2009

(54) METHOD AND SYSTEM FOR UTILIZING DRAM COMPONENTS IN A SYSTEM-ON-CHIP

(75) Inventors: Kun Lung Chen, Taipei (TW); Shine Chung, Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 75 days.

(21) Appl. No.: 11/638,596

(22) Filed: Dec. 13, 2006

(65) Prior Publication Data

US 2008/0142860 A1 Jun. 19, 2008

(51) Int. Cl.
  G11C 11/24 (2006.01)
  G11C 11/34 (2006.01)
  H01L 29/94 (2006.01)
(52) U.S. Cl. ........................ 365/149; 365/174; 254/303; 254/310
(58) Field of Classification Search ................. 365/149, 365/174; 257/303, 310
  See application file for complete search history.

(56) References Cited

U.S. PATENT DOCUMENTS

| 5,589,847 | A  | * | 12/1996 | Lewis ........................... 345/98 |
| 6,159,793 | A  | * | 12/2000 | Lou ............................. 438/255 |
| 6,181,314 | B1 | * | 1/2001  | Nakajima et al. ........... 345/100 |
| 6,271,099 | B1 | * | 8/2001  | Lou ............................. 438/396 |
| 6,348,705 | B1 | * | 2/2002  | Hendrix ....................... 257/295 |
| 6,956,515 | B2 | * | 10/2005 | Keehr et al. ................. 341/150 |
| 7,300,840 | B2 | * | 11/2007 | Lin et al. ..................... 438/253 |
| 2004/0021166 | A1 | * | 2/2004 | Hyde et al. .................. 257/314 |
| 2004/0070528 | A1 | * | 4/2004 | Keehr et al. ................. 341/150 |
| 2005/0127756 | A1 | * | 6/2005 | Shepard et al. ............... 307/18 |
| 2005/0191820 | A1 | * | 9/2005 | Tu et al. ...................... 438/396 |
| 2006/0223276 | A1 | * | 10/2006 | Lin et al. ..................... 438/393 |
| 2007/0293163 | A1 | * | 12/2007 | Kilpatrick et al. ............. 455/84 |
| 2008/0048760 | A1 | * | 2/2008 | El Rai et al. ................. 327/524 |
| 2008/0122031 | A1 | * | 5/2008 | DeNatale et al. ............ 257/532 |

OTHER PUBLICATIONS

Yuji, Yokoyama et al., "A 1.8-V Embedded 18-Mb DRAM Macro with a 9-ns RAS Access Time and Memory-Cell Area Efficiency of 33%", IEEE Journal of Solid-State Circuits, vol. 36, No. 3, Mar. 2001, pp. 503 -509.

* cited by examiner

*Primary Examiner*—Ly D Pham
(74) *Attorney, Agent, or Firm*—K & L Gates LLP

(57) ABSTRACT

A system-on-chip semiconductor circuit includes a logic circuit having at least one first transistor with a thin gate dielectric, at least one dynamic random access memory cell coupled with the logic circuit having at least one storage capacitor and at least one thick gate dielectric access transistor, and an analog circuit operable with the logic circuit and the memory cell having at least one thick gate dielectric switched transistor and at least one switched capacitor, wherein the storage capacitors of the memory cell and the switched transistors are of the same type, and wherein the thick gate dielectric switched transistor and the switched capacitor of the analog circuit are made by a process for making the dynamic random access memory cell.

15 Claims, 5 Drawing Sheets

US 7,564,709 B2

METHOD AND SYSTEM FOR UTILIZING DRAM COMPONENTS IN A SYSTEM-ON-CHIP

BACKGROUND

The present invention relates generally to integrated circuit (IC) designs, and more particularly to a design for a system-on-chip (SoC) including a core logic circuit, a memory module and an analog circuit with switched capacitors.

In an IC industry, an SoC is typically comprised of a digital logic circuit, a memory module, and an analog circuit. The logic circuit includes core transistors and I/O or peripheral transistors. The core transistors can be a plurality of high-speed transistors having thin gate dielectrics. The I/O transistors can be a plurality of low-speed transistors having thick gate dielectrics. The memory module, such as a DRAM cell array, is comprised of a number of memory cells, each of which typically includes an access transistor and a storage capacitor, such as a metal-insulator-metal (MiM) capacitor. The equivalent silicon oxide thickness (EOT) of gate dielectric of the access transistor is designed to be thicker than that of the core logic transistor in order to prevent leakage current that hampers the functionality of the DRAM cell. The storage capacitor holds a bit of information—0 or 1. When the storage capacitor is charged with electrons, it represents logic 1. When the storage capacitor is empty, it represents logic 0. The access transistor allows a control circuitry to read or write the capacitor. Due to the current leakage of the capacitor, the control circuitry needs to recharge or refresh all the capacitors holding logic 1s by reading the cells and then writing logic is right back into them. This refresh operation happens automatically thousands of times in one second. When the DRAM cells are off power, their data disappears. The analog circuit often includes a switched capacitor circuit comprised of two switched capacitors, two switched transistors, and an operational amplifier. In order for the switched capacitor circuit to function properly, the ratio of capacitance between the two switched capacitors needs to be kept at a very precise level.

Conventionally, although the transistors of the analog switched capacitor circuit are fabricated substantially during the same processes as those for making the transistors in the digital logic circuit, the capacitors of the switched capacitor circuit are fabricated in a process separate from those by which the storage capacitors of memory cells are fabricated. This increases manufacturing costs and reduces yield rates, which become increasingly significant in higher generations of semiconductor processing technology, such as the 90 nm generation.

Moreover, the conventional fabrication process for the switched capacitor circuit constructs the switched capacitors in a planar fashion, instead of a vertical fashion. As a result, the conventional switched capacitor tends to be bulky, and usually occupies a large area.

Thus, it is desirable to design a method and system for implementing an SoC including a logic circuit, a memory module and an analog circuit that utilizes layout area efficiently, and can be fabricated cost-effectively.

SUMMARY

A system-on-chip semiconductor circuit includes a logic circuit having a first transistor (core logic transistor) with a first gate dielectric, at least one dynamic random access memory cell coupled with the logic circuit having at least one storage capacitor and at least one second transistor with a second gate dielectric, and an analog circuit operable with the logic circuit and the memory cell having at least one switched capacitor and at least one third transistor with a third gate dielectric, wherein the switched capacitor is made substantially by the same process for making the storage capacitor, therefore the switched capacitor has substantially the same structure as that of the storage capacitor.

The construction and method of operation of the invention, however, together with additional objects and advantages thereof will be best understood from the following description of specific embodiments when read in connection with the accompanying drawings.

DESCRIPTION

The present disclosure provides a method and system for using embedded DRAM cells in system-on-chip (SoC) applications. A DRAM cell has typically at least one access transistor and at least one storage capacitor, and the storage capacitor is typically high area efficiency capacitors such as the vertically constructed metal-insulator-metal (MiM) capacitors. Since the an SoC always has a DRAM module, it is desired that transistors and capacitors in the analog portion of the SoC be formed by the same processes as those for the memory module in order to reduce manufacturing costs and improving area efficiency.

Figure 1:
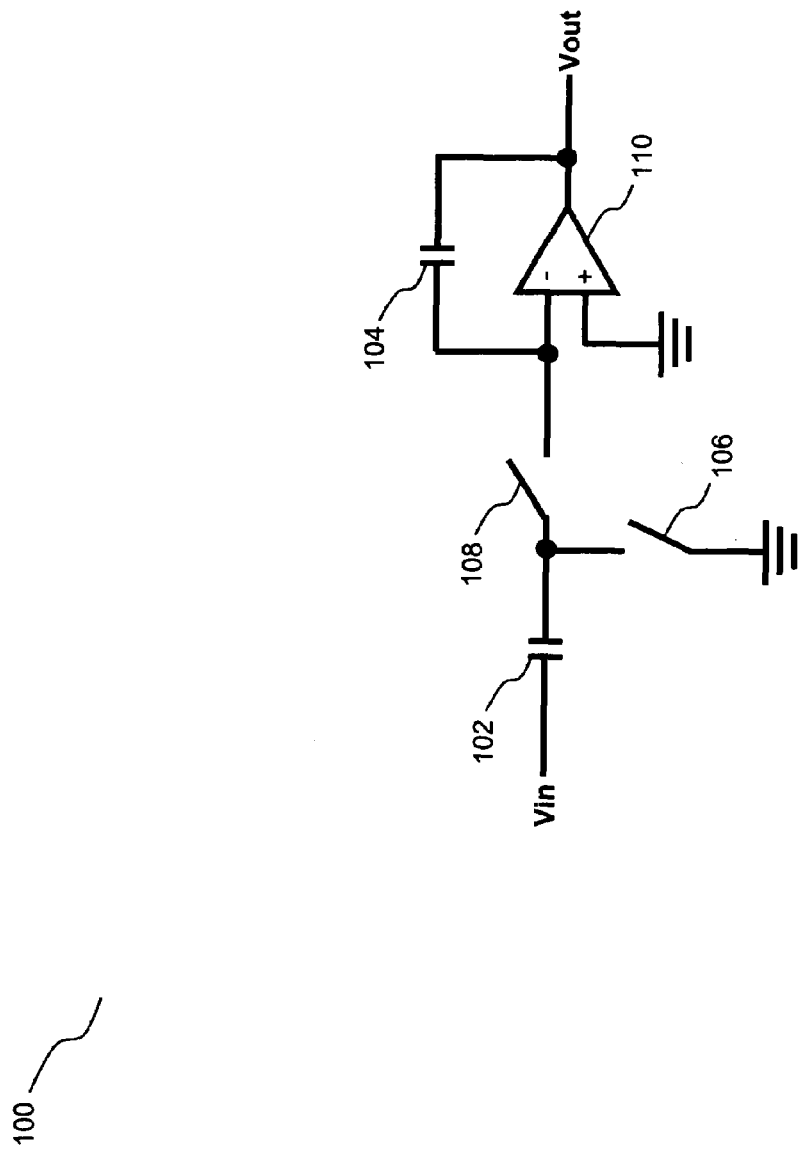
FIG. 1 illustrates a switched capacitor circuit in accordance with one embodiment of the present invention.

FIG. 1 illustrates a switched capacitor circuit 100 in an analog portion of an SoC in accordance with one embodiment of the present invention. The switched capacitor circuit 100 comprises two switched capacitors 102 and 104, two switched transistors 106 and 108, and an operational amplifier (op-amp) 110. It is understood by people skilled in the art that the switches 106 and 108 can be implemented by a number of transistors. In order for the switched capacitor circuit 100 to function properly, the ratio of capacitance of the switched capacitors 102 and 104 needs to be kept at a very precise level. During operation, the switched transistors 106 and 108 are designed to be turned on and off alternatively in order to charge the switched capacitors 102 and 104 to provide an output voltage Vout that is equal to $-Vin^*(C_{104}/C_{102})$, where Vin represents the input voltage, $C_{102}$ represents the capacitance of the capacitor 102, and $C_{104}$ represents the capacitance of the capacitor 104.

The present invention simplifies the process for making an SoC, in which at least one non-core logic circuit (e.g., I/O), at least one memory module, and at least one analog circuit are involved. In the SoC, at least one analog circuit, such as a switched capacitor circuit should use the same processes as those for making a DRAM module, in order to reduce the manufacturing costs and increase the area efficiency.

In this embodiment, the switched capacitors 102 and 104 are made substantially by the same process for making a storage capacitor in a DRAM cell. Thus, the structure of the switched capacitors 102 and 104 are similar to that of the DRAM storage capacitor, which can be a MiM capacitor, a poly-insulator-poly (PIP) capacitor, or a trench capacitor. Preferably, the switched capacitors 102 and 104 are a crown type MiM capacitor in order to provide high precision matching of capacitance. Table 1 below shows that for the same amount of area, a crown type MiM capacitor can store significantly more charges than a conventional planar type MiM capacitor.

TABLE 1

|  | Conventional MiM (planar-type) | 1T-MiM (crown-type) |
|---|---|---|
| Capacitance | 4.8 pf | 15 pf |
| STD Deviation | 0.3% | 0.17% |
| Area | ~3000 um$^2$ | ~3000 um$^2$ |

Figure 2:
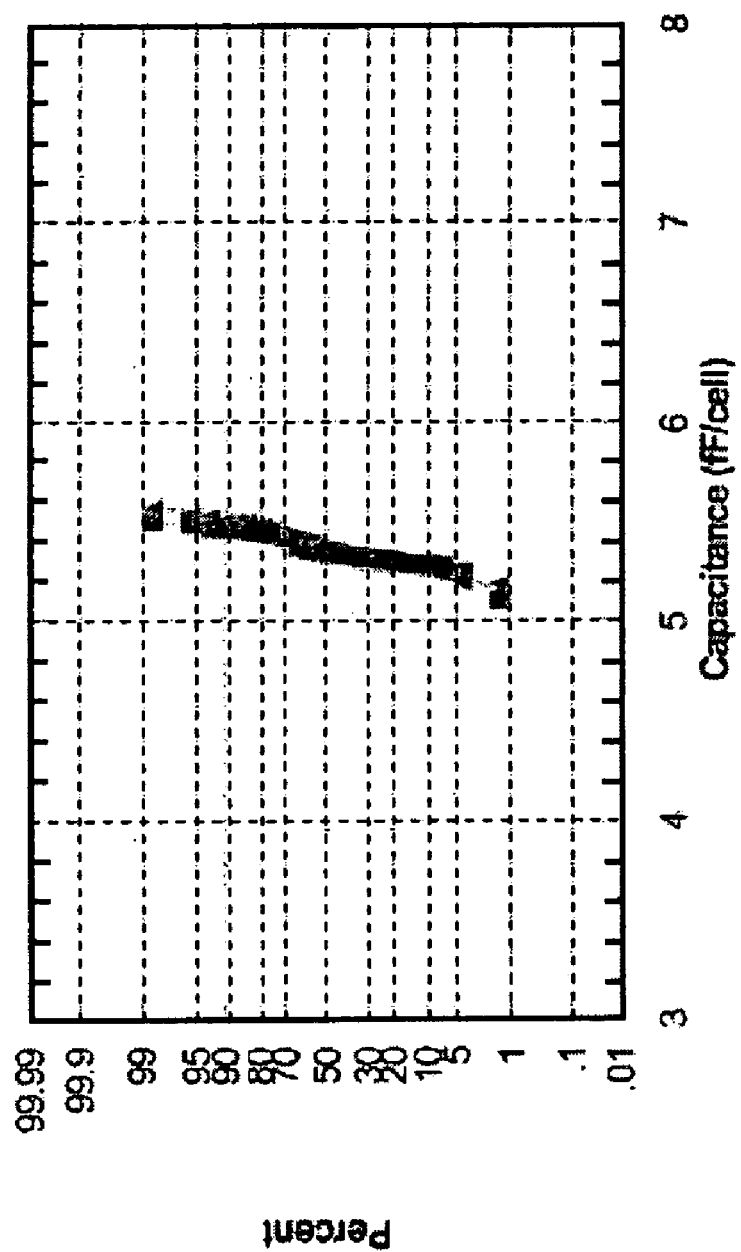
FIG. 2 shows a distribution of capacitance for cells on a 12-inch wafer.

FIG. 2 shows a distribution of cell capacitance for cells on a 12-inch wafer. The average capacitance for 100 cells is 5.35 fF, −3σ at 5.2 fF, and +3σ at 5.5 fF, where a sigma standard deviation (σ) equals 0.05 fF. The distribution can be made narrower by using lots of cells as a unit. For example, to make a 5 pF unit capacitor for switched capacitor circuits, about 1,000 cells of 5 fF will be connected together. The standard deviation is reduced to 1/sqrt(N)=1/sqrt(1000/100), or 1/3.1 of the cell capacitor. One standard deviation to average capacitance ratio is reduced from 0.05/3.1=0.016 f to 5.35 f, which is about 0.30%. In other words, the worst-case mismatch can be controlled to be less than 0.30%, or 8-bit accuracy, which is good enough for most switched capacitor circuits. The above data is based on a wafer. The actual circuit size is in the order of a few hundred microns. As it is understood that the transistors having a thicker gate dielectric can be an access transistor of the embedded DRAM cell or even an I/O transistor of the logic circuit, which is not a part of the core of the logic circuit design.

In the embodiment shown in FIG. 1, the analog circuit components, such as the switched transistors 106, 108 and the switched capacitors 102, and 104 are formed by the same process used for making DRAM modules so that the gate dielectric layer of the switched transistors 106 and 108 have a relatively thicker EOT than those of the transistors in the core logic circuit. During the manufacturing, an SoC needs to conform to certain predetermined design rules and conditions. For instance, if non-high-K material having a dielectric constant lower than 8 is used for the gate dielectric, the EOT is required to be equal or less than 25 Å. If a high-K material having a dielectric constant higher than 8 is used, the EOT needs to be equal to or less than 50 Å.

Since the switched transistors 106, 108 and the switched capacitors 102, and 104 are made by DRAM fabrication processes, without using a separate set of processes for analog circuits, the manufacturing costs and cycle time of the switched capacitor circuit 100 can be greatly reduced. For example, in the case where an SoC chip is fabricated by a process flow of 90 nm node technology, table 2 below shows that the proposed embodiment can save four lithography masks (i.e., N-well, P-well, N-type LDD, and P-type LDD implant masks), compared with conventional methods.

TABLE 2

|  | SoC made by the proposed embodiment of this invention | SoC made by conventional methods |
|---|---|---|
| Mask required | A masks | A + 4 masks |
| Manufacturing cost | X | X + 10% |
| Manufacturing cycle time | Y days | Y + 10 days |

The saving of four lithography masks can reduce the manufacturing cost and cycle time by 10% and 10 days, respectively. The switched transistor 108 has a relatively thick gate dielectric than that of a transistor in a core logic circuit. This thick gate dielectric is designed to prevent leakage current that hampers the DRAM functionality. The thicker gate dielectric transistors can be used in any analog circuits at no additional cost as they are processed by the same DRAM processes. For example, such thicker oxide devices can be used as decoupling capacitors and feedback filter (loop filter) in phase-lock-loops as well. In addition, although the EOTs of the thick and thin gate transistors may be different, the material for making them can be the same in order to simplify the manufacturing process.

Figure 3:
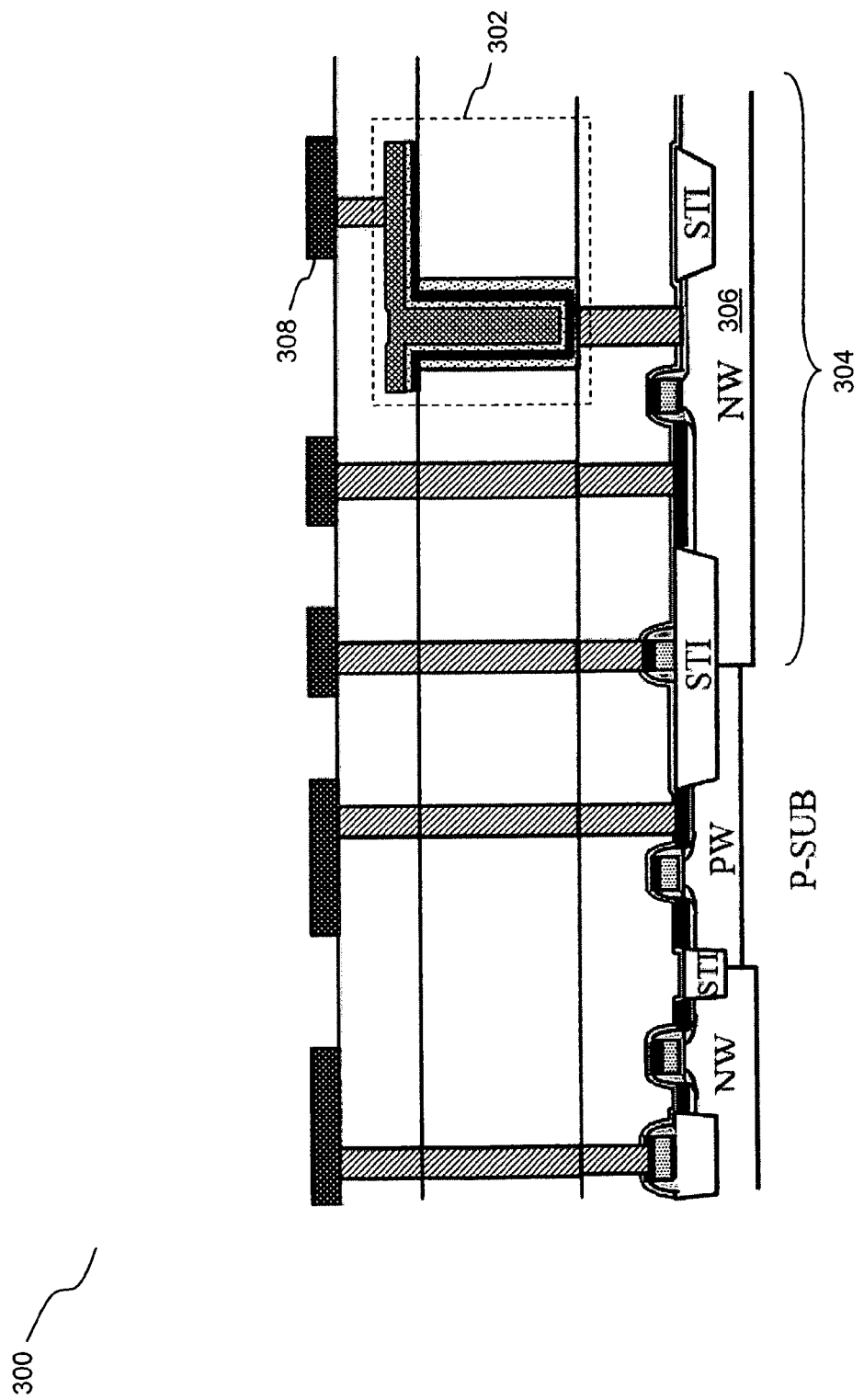
FIG. 3 illustrates a MiM capacitor structure for a switched capacitor in accordance with one embodiment of the present invention.

FIG. 3 illustrates a cross section 300 showing how a MiM structure 302 of a DRAM cell can be used as a capacitor in the switched capacitor circuit shown in FIG. 2 in accordance with one embodiment of the invention. Metal-insulator-metal (MIM) structures have been used to form capacitors, since it possesses a low-interfacial reaction specificity, which enhances the performance of the capacitor. In the cross section 300, the MiM structure 302 is formed as a part of a DRAM memory cell 304 connected between an active region 306 and a contact 308. The DRAM memory cell 304 rests on a substrate, which comprises semiconductor materials, such as glass, bulk silicon, or SOI. The MiM structure 302 can be formed by a damascene or lithography/plasma process. The bottom and top electrodes can be made of metal containing materials, such as aluminum alloy or copper. With the high capacitance per area ratio of the MiM structure 302, it is ideal to have them being used as a cell capacitor in SoC applications as charge pumps or switched capacitors. Such MiM capacitor can be formed with some particular arrangements as described below to reduce processing variations.

Figure 4:
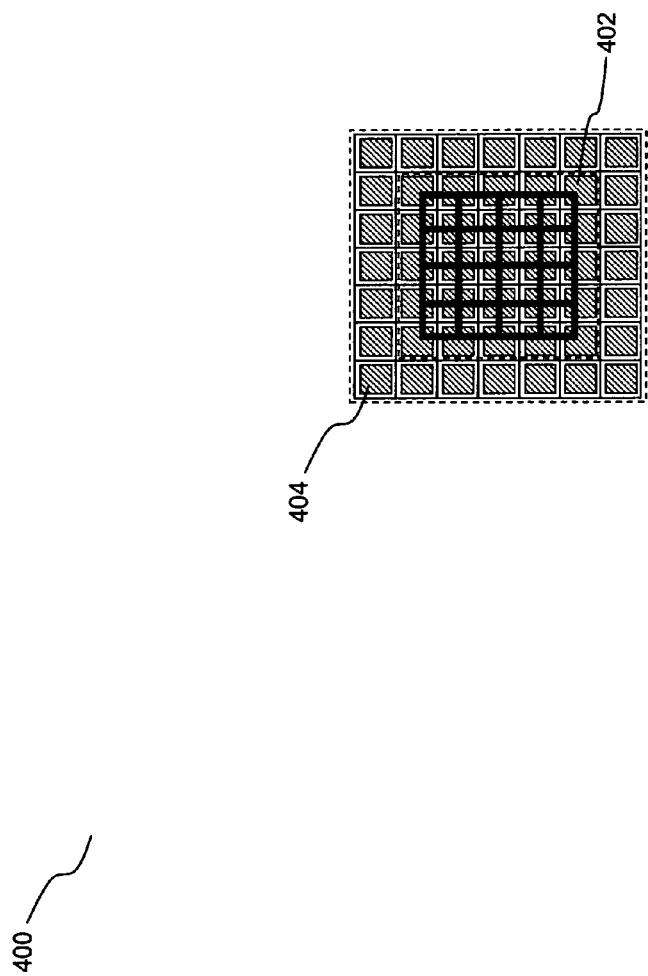
FIG. 4 illustrates a 7×7 capacitor array in accordance with one embodiment of the present invention.

FIG. 4 illustrates a two-dimensional capacitor array 400 comprised of 7×7 MiM capacitor cells 404 to be implemented in an SoC in accordance with one embodiment of the present invention. Each MiM cell within this capacitor array is connected to adjacent MiM cells through interconnects (not shown). A ring of MiM cells on the exterior portion of the capacitor array, which is not used for providing functionalities, is implemented with dummy cells to ensure that all internal cells 402 can be processed uniformly with a much reduced defect rate during the printing and etching processes. These dummy cells can be used to function as decoupling capacitors, if needed.

It is noted that the capacitor array can be typically constructed to have 0.5 pF or 1 pF for its capacitance. It is also noted that the 7×7 formation is only an example, and the capacitor array can take on various patterns that is different from the one shown in FIG. 4.

Figure 5:
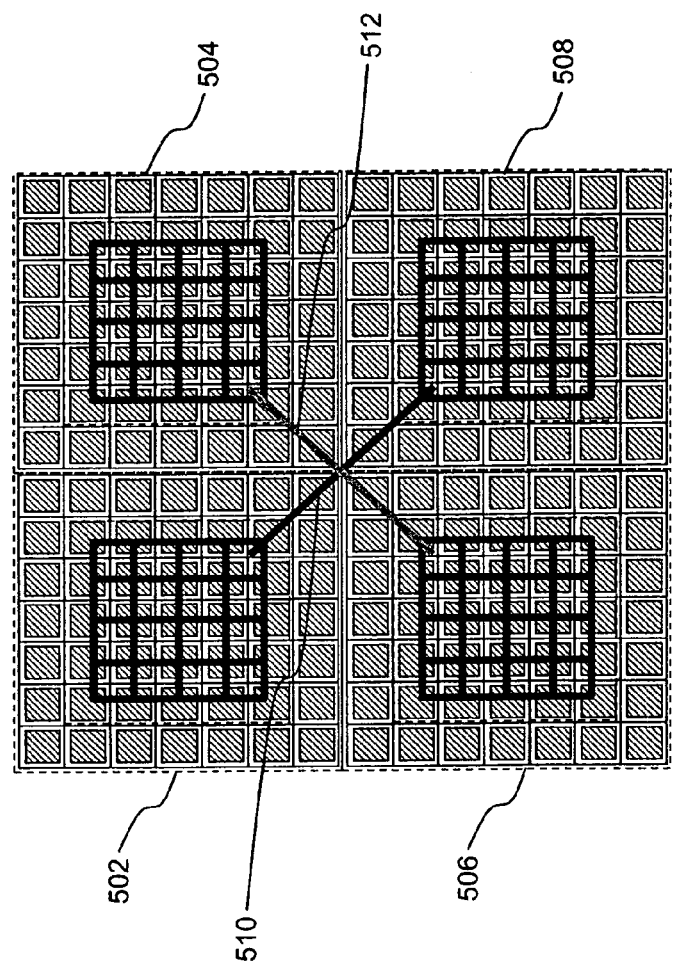
FIG. 5 illustrates a diagram showing a centroid arrangement of multiple capacitor arrays in accordance with one embodiment of the present invention.

FIG. 5 illustrates a diagram 500 showing a centroid capacitor layout structure comprising four capacitor arrays 502, 504, 506, and 508 to be used in an SoC in accordance with one embodiment of the present invention. In this example, each of the capacitor arrays 502, 504, 506, and 508 is identical to the capacitor array 400 in FIG. 4, and taken together, they are used to construct the capacitors 102 and 104 used within the switched capacitor circuit 100 shown in FIG. 1. For instance, each of the two capacitors 102 and 104 is formed by two equal capacitor arrays that are placed and connected diagonally from each other. The capacitor 102 can be formed by connecting the capacitor arrays 502 and 508 together diagonally (with the line 510 indicating the connection thereof), while the capacitor 104 can be formed by connecting the capacitor arrays 504 and 506 together diagonally (with the line 512 indicating the connection thereof). By constructing the capacitors in this manner, any process variation in horizontal, vertical, and/or diagonal directions can be canceled such that the capacitance ratio between the capacitors 102 and 104 can be kept steady. It is understood that other symmetric arrangements of the capacitor layout can also be used with regard to a reference center point in order to cancel out the process variations in the horizontal, vertical, and diagonal directions. For the purpose of this application, such arrangement is referred to as a symmetric centroid arrangement. Note that the dummy rings in FIG. 4 do not necessarily surround units 502, 504, 506, and 508 separately, but can surround them as a whole.

In an SoC, other components such as the transistor within the I/O region of the logic circuit and the feedback filter of the PLL circuit can be fabricated with the same mask used for making the thick oxide transistors of the embedded memory components, the overall manufacturing cost can also be greatly reduced.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A system-on-chip semiconductor circuit comprising:
   a logic circuit having at least one first transistor with a first gate dielectric;
   at least one dynamic random access memory cell coupled with the logic circuit, having at least one storage capacitor and at least one second transistor with a second gate dielectric; and
   an analog circuit operable with the logic circuit and the memory cell, having at least one switched capacitor and at least one third transistor with a third gate dielectric,
   wherein the switched capacitor has substantially the same structure as the storage capacitor, and
   wherein each capacitor is formed in a two-dimensional array of capacitor cells where an exterior row or column of the array contains non-functional capacitor cells.

2. The circuit of claim 1, wherein the switched capacitor is a metal-insulator-metal capacitor.

3. The circuit of claim 1, wherein the switched capacitor is a crown-type metal-insulator-metal capacitor.

4. The circuit of claim 1, wherein the first gate dielectric transistor contains a non-high K material having a dielectric constant approximately smaller than 8, and the first gate dielectric has an equivalent silicon oxide thickness equal to or less than 25 Å.

5. The circuit of claim 1, wherein the first gate dielectric transistor contains a high K material having a dielectric constant approximately larger than 8, and the first gate dielectric has an equivalent silicon oxide thickness equal to or less than 50 Å.

6. A system-on-chip semiconductor circuit comprising:
   a logic circuit having at least one first transistor with a first gate dielectric;
   at least one dynamic random access memory cell coupled with the logic circuit, having at least one storage capacitor and at least one second transistor with a second gate dielectric; and
   an analog circuit operable with the logic circuit and the memory cell, having at least one switched capacitor and at least one third transistor with a third gate dielectric,
   wherein the switched capacitor has substantially the same structure as the storage capacitor, and
   wherein each capacitor is formed in at least two two-dimensional capacitor arrays of capacitor cells, which are arranged in a centroid symmetric arrangement.

7. The circuit of claim 6, wherein the switched capacitor is a metal-insulator-metal capacitor.

8. The circuit of claim 6, wherein the switched capacitor is a crown-type metal-insulator-metal capacitor.

9. The circuit of claim 6, wherein the first gate dielectric transistor contains a non-high K material having a dielectric constant approximately smaller than 8, and the first gate dielectric has an equivalent silicon oxide thickness equal to or less than 25 Å.

10. A method for fabricating a system-on-chip semiconductor circuit comprising:
    forming a logic circuit having at least one first transistor with a first gate dielectric;
    forming at least one dynamic random access memory cell coupled with the logic circuit, having at least one storage capacitor and at least one second transistor with a second gate dielectric; and
    forming an analog circuit operable with the logic circuit and the memory cell, having at least one switched capacitor and at least one third transistor with a third gate dielectric,
    wherein the switched capacitor was made substantially by the same process steps of fabricating the storage capacitor, and
    wherein each capacitor is formed in a two-dimensional array of capacitor cells where an exterior row or column of the array contains non-functional capacitor cells.

11. The method of claim 10, wherein both bottom and top electrodes of the switched capacitor are made of metal containing materials.

12. The method of claim 10, wherein the second gate dielectric is made of the same materials as the first gate dielectric.

13. The method of claim 10, wherein the second gate dielectric has an equivalent silicon oxide thickness greater than that of the first gate dielectric.

14. The method of claim 10, wherein the first gate dielectric transistor has a non-high K material having a dielectric constant approximately smaller than 8, and the first gate dielectric has an equivalent silicon oxide thickness equal to or less than 25 Å.

15. The method of claim 10, wherein the first gate dielectric transistor has a high K material having a dielectric constant approximately larger than 8, and the first gate dielectric has an equivalent silicon oxide thickness being equal to or less than 50 Å.

* * * * *